United States Patent [19]

Tago

[11] Patent Number: 4,885,544
[45] Date of Patent: Dec. 5, 1989

[54] DETERMINATION CIRCUIT FOR DATA COINCIDENCE

[75] Inventor: Nobuo Tago, Yokohama, Japan

[73] Assignee: Kabushiki Kaisha Toshiba, Kawasaki, Japan

[21] Appl. No.: 291,269

[22] Filed: Dec. 28, 1988

[30] Foreign Application Priority Data

Dec. 28, 1987 [JP] Japan .................. 62-335737

[51] Int. Cl.$^4$ .............. H03K 3/013; H03K 5/24; H03K 17/687; H03K 19/096
[52] U.S. Cl. .................. 328/110; 307/471; 307/481; 307/585
[58] Field of Search ............ 307/471, 472, 445, 443, 307/450, 451, 452, 479, 480, 481, 585, 279; 328/110

[56] References Cited

U.S. PATENT DOCUMENTS

| 4,694,274 | 9/1987 | Shimada et al. | 340/146.2 |
|---|---|---|---|
| 4,710,650 | 12/1987 | Shoji | 307/471 X |
| 4,785,204 | 11/1988 | Terada et al. | 307/451 |
| 4,797,625 | 1/1989 | Nakazawa | 307/471 X |
| 4,808,855 | 2/1989 | Lloyd | 307/471 X |

FOREIGN PATENT DOCUMENTS

0147842A3 12/1984 European Pat. Off.
59-45720 3/1984 Japan.

OTHER PUBLICATIONS

"IBM Technical Disclosure Bulletin", vol. 27, No. 8, Jan. 1985, Lee et al, Low Device Count Clocked CMOS Exclusive OR Circuit.

*Primary Examiner*—John S. Heyman
*Assistant Examiner*—David R. Bertelson
*Attorney, Agent, or Firm*—Foley & Lardner, Schwartz, Jeffery, Schwaab, Mack, Blumenthal & Evans

[57] ABSTRACT

A coincidence determination circuit capable of reducing number of elements by providing a time period during which the coincidence determination is enabled. This coincidence determination circuit comprises, a first comparison unit provided with a plurality of first bit comparison units corresponding to a plurality of bits, each bit comparison unit comprising a first P-channel transistor having a gate to which a clock signal is inputted, a second P-channel transistor having a gate to which reference data of a certain bit is inputted, and a third P-channel transistor having a gate to which inverted data of the data of that bit to be compared is inputted, the first to third P-channel transistors being connected in series, respective outputs of the first bit comparison units being wired-OR connected to a first output line, said first output line serving to pull its signal level down in response to the clock signal; a second comparison unit provided with a plurality of second bit comparison units corresponding to a plurality of bits, each bit comparison unit comprising a first N-channel transistor having a gate to which an inverted signal of the clock signal is inputted, a second N-channel transistor having a gate to which reference data of a certain bit is inputted, and a third N-channel transistor having a gate to which inverted data of the data of that bit to be compared is inputted, the first to third N-channel transistors being connected in series, respective outputs of the second bit comparison units being wired-OR connected to a second output line, the second output line serving to pull its level up by the inverted signal of the clock signal; and an output unit for producing a coincidence output when the first output line is at a low level and the second output line is at a high level.

2 Claims, 3 Drawing Sheets

DETERMINATION CIRCUIT FOR DATA COINCIDENCE

BACKGROUND OF THE INVENTION

This invention relates to a coincidence determination circuit, and more particularly to a coincidence determination circuit for coincidence determination of multiple data of multi-bits, comprised of combined CMOS type FETs.

The coincidence determination of two data signals can be normally realized by using an exclusive logical sum circuit (which will be referred to as "EOR" hereinafter). Accordingly, the coincidence determination circuit for determining coincidence between two multi-bit data can be realized by combining a puurality of EORs.

In a conventional coincidence determination circuit, the number of semiconductor elements is considerably increased in accordance with the increase in the number of bits of data to be compared, resulting in the problem that the occupation area of elements increases when an attempt is made to realize such a circuit with a semiconductor integrated circuit.

Moreover, in the conventional coincidence determination circuit, the number of wirings coupling EORs for comparing each bit and a NOR circuit for determining the coincidence among all bits becomes large, resulting in the problem that the occupation area of elements also becomes large.

SUMMARY OF THE INVENTION

Accordingly, an object of this invention is to provide a coincidence determination circuit capable of reducing the number of elements, the number of wirings and the occupation area of elements to minimum values, respectively.

In accordance with this invention, there is provided a coincidence determination circuit comprising: a first comparison unit provided with a plurality of first bit comparison units corresponding to a plurality of bits, each bit comparison unit comprising a first P-channel transistor having a gate to which a clock signal is inputted, a second P-channel transistor having a gate to which reference data of a certain bit is inputted, and a third P-channel transistor having a gate to which inverted data of the data of that bit to be compared is inputted, the first to third P-channel transistors being connected in series, respective outputs of said first bit comparison units being wired-OR connected to a first output line, the first output line serving to pull its signal level down in response to the clock signal; a second comparison unit provided with a plurality of second bit comparison units corresponding to a plurality of bits, each bit comparison unit comprising a first N-channel transistor having a gate to which the inverted signal of the clock signal is inputted, a second N-channel transistor having a gate to which reference data of a certain bit is inputted, and a third N-channel transistor having a gate to which inverted data of the data of that bit to be compared is inputted, the first to third N-channel transistors being connected in series, respective outputs of said second bit comparison units being wired-OR connected to a second output line, the second output line serving to pull its level up by the inverted signal of the clock signal; and an output unit for producing a coincidence output when the first output line is at a low level and the second output line is at a high level.

In this invention, the time period during which the coincidence determination is enabled or allowed and the time period during which such determination is disabled or inhibited are set. During the time period that the determination is inhibited, the result of the coincidence determination is set to "truth". Where the coincidence determination has been enabled if data is not coincident for any bit, the result of the coincidence determination changes to "false". Thus, determination of coincidence or noncoincidence can be made. As described above, the number of elements can be reduced by providing a time period during which the coincidence determination is enabled.

In addition, the reduction effect becomes more conspicuous as the number of bits of data increases. Accordingly, even when increase of area for wirings are considered, the element occupation area can be reduced by the employment of the circuit of this invention.

DESCRIPTION OF THE PREFERRED EMBODIMENTS

Figure 1:
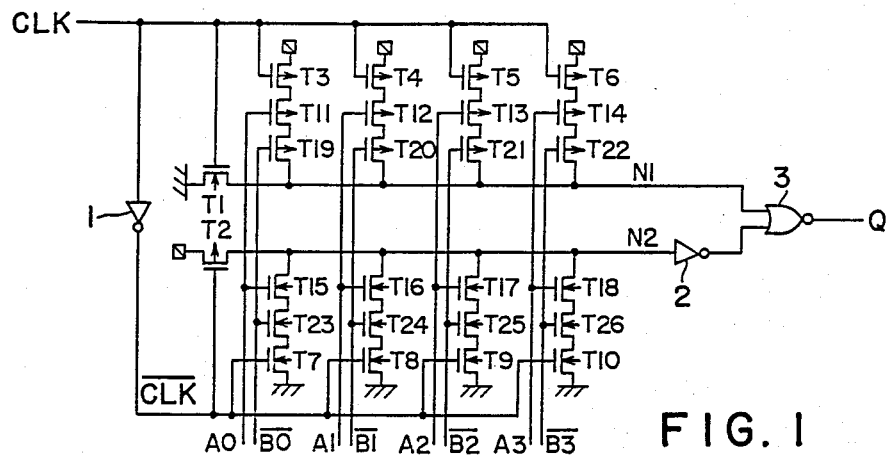
FIG. 1 is a circuit diagram showing a coincidence determination circuit for carrying out a comparative determination for two 4-bit data according to an embodiment of this invention.

FIG. 1 is a circuit diagram showing a coincidence determination circuit according to an embodiment of this invention. The circuit of FIG. 1 shows a circuit for determining the coincidence between two 4-bit data. Namely, this circuit is constructed to make a comparison between two 4-bit data of input data $A_0$ to $A_3$ and input data $B_0$ to $B_3$ bit by bit to output an output Q of "1" (truth) when all the bits are in correspondence with each other ($A_0=B_0$, $A_1=B_1$, $A_2=B_2$, and $A_3=B_3$). The circuit for making a comparison between the first bit data $A_0$ and $B_0$ comprises P-channel type MOS transistors $T_3$, $T_{11}$ and $T_{19}$ arranged so as to serially connect the source of one transistor and the drain of the adjacent transistor, and N-channel type MOS transistors $T_{15}$, $T_{23}$ and $T_7$ arranged in the same manner as in the P channel type transistors. Input data $A_0$ is inputted to the gates of transistors $T_{11}$ and $T_{15}$, and input data $B_0$ is inverted and inputted to the gates of transistors $T_{19}$ and $T_{23}$. The gate of transistor $T_3$ is connected to the clock (CLK) line, and the gate of transistor $T_7$ is connected to the clock line ($\overline{\text{CLK}}$) inverted by an inverter 1. Moreover, clock lines CLK and $\overline{\text{CLK}}$ are connected to the gates of N-channel type MOS transistor $T_1$ and P-channel type transistor $T_2$, respectively, and the drain terminals of transistors $T_1$ and $T_2$ are connected to the drain terminals of transistors $T_{19}$ and $T_{15}$, respectively.

Furthermore, the drain output line $N_1$ is connected to one input terminal of the NOR circuit 3 and the drain output line $N_2$ is connected to the other input terminal thereof through inverter 2. Thus, output Q of the coincidence determination circuit is obtained as an output of the NOR circuit 3.

Similarly, the second bit data $A_1$ and $B_1$ are compared with each other by the comparison stage comprising P-channel type MOS transistors $T_4$, $T_{12}$ and $T_{20}$ and N-channel type MOS transistors $T_{16}$, $T_{24}$ and $T_8$ in combination; the third bit data $A_2$ and $B_2$ are compared with each other by the comparison stage comprising P-channel type MOS transistors $T_5$, $T_{13}$ and $T_{21}$ and N-channel type MOS transistors $T_{17}$, $T_{25}$ and $T_9$ in combination; and the fourth bit data $A_3$ and $B_3$ are compared with end other by the comparison stage comprising P-channel type MOS transistors $T_6$, $T_{14}$ and $T_{22}$ and N-channel type MOS transistors $T_{18}$, $T_{26}$ and $T_{10}$ in combination.

The operation of this coincidence determination circuit will be described below.

Initially, when clock signal CLK for controlling "enable" and "disable" of the coincidence determination circuit is caused to be "1", transistor $T_1$ becomes conductive and transistors $T_3$ to $T_6$ become nonconductive. Thus, the output N1 is set to the "0" level. Similarly, the output $N_2$ is set to the "1" level. Since it is now assumed that the output Q is set so that it becomes "1" under this condition, i.e., input data $A_0$ to $A_3$ and $B_0$ to $B_3$ are coincident with each other, it is required to form the output circuit so that the output Q is not used as the determination result for a time period during which clock CLK represents "1". When clock CLK is caused to shift to "0", transistors $T_1$ and $T_2$ become nonconductive and transistors $T_3$ to $T_{10}$ become conductive, resulting in a comparison enable state, i.e., a state in which coincidence determination is allowed.

In inputting data, one group of data to be compared (data $B_0$ to $B_3$ in this embodiment) are inputted with all the bits thereof being inverted. Thus, the output $N_1$ and $N_2$ exhibit high impedance only when respective bits of data $A_0$ to $A_3$ and $B_0$ to $B_3$ are all in correspondence with each other, so that the output Q remains in the "1" state which is the same as the disable state. If any pair of bits of $A_0$ and $B_0$, $A_1$ and $B_1$, $A_2$ and $B_2$ and $A_3$ and $A_4$ are not coincident with each other, either the state where the output $N_1$ becomes "1" or the state where the output $N_2$ becomes "0" necessarily appears, so that "0" is outputted as the output Q.

Figure 2:
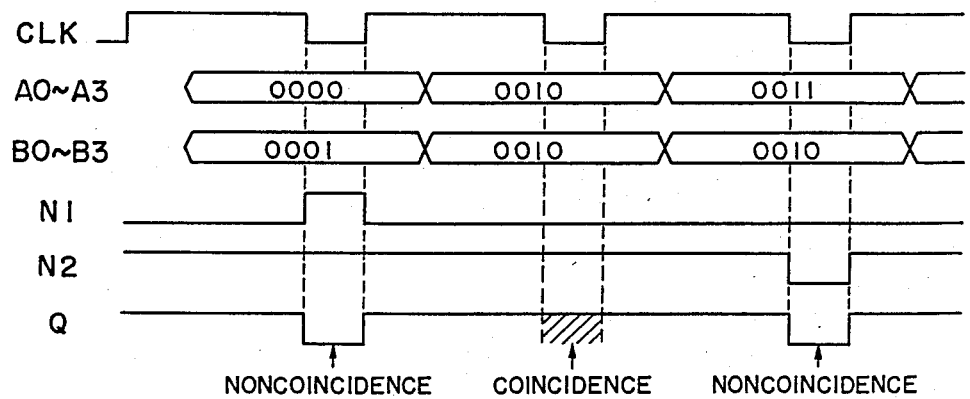
FIG. 2 is a timing chart showing the transient operation of the circuit shown in FIG. 1.

FIG. 2 shows a timing chart for explaining the operation of the circuit shown in FIG. 1. As shown in this figure, when clock signal CLK represents "1", the coincidence determination is disabled, and the coincidence determination is enabled when clock signal CLK represents "0". When output Q represents "1", respective bits of input data $A_0$ to $A_3$ and $B_0$ to $B_3$ are to be coincident with each other.

Figure 3:
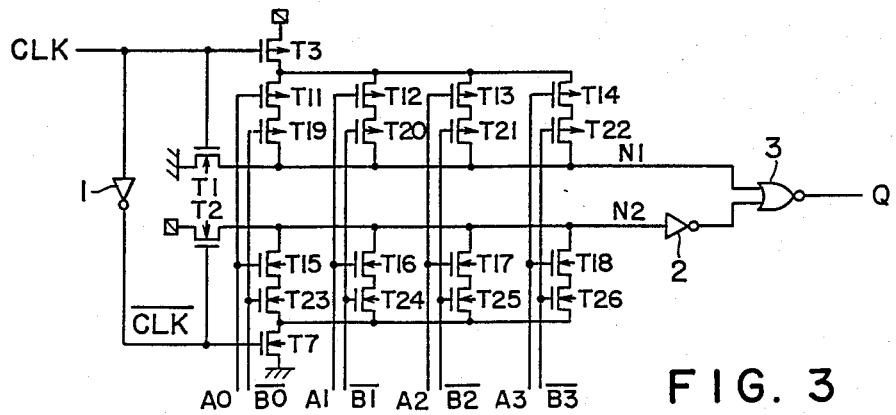
FIG. 3 is a circuit diagram showing a modification of the circuit shown in FIG. 1.

FIG. 3 is a circuit diagram showing a modified embodiment of the circuit of FIG. 1.

The circuit of FIG. 3 differs from the circuit of FIG. 1 in that P-channel type MOS transistors $T_4$, $T_5$ and $T_6$ and N-channel type MOS transistors $T_8$, $T_9$ and $T_{10}$ receiving clock signals CLK and $\overline{CLK}$ to deliver a current to the transistors for comparison are omitted, and are replaced by transistors $T_3$ and $T_7$ which are used in common to the all bits, respectively.

Accordingly, this circuit permits the total number of transistors to be decreased by six from that of the circuit of FIG. 1. It is to be noted that it is required for transistors $T_3$ and $T_7$ to be transistors having a large current supply ability.

Figure 4:
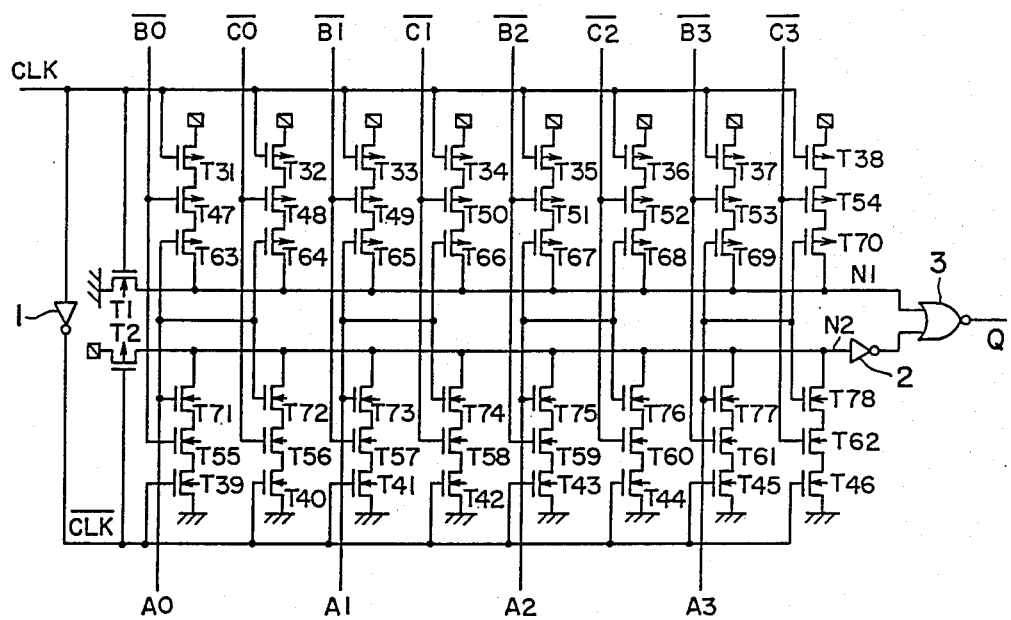
FIG. 4 is a circuit diagram showing a coincidence determination circuit for carrying out a comparative determination for three 4-bit data according to another embodiment of this invention.

In addition to the above-described embodiment, this invention is applicable to a coincidence determination circuit for three multi-bit data or more. FIG. 4 shows an embodiment of a coincidence determination circuit for determining the coincidence between three data of 4 bits. As seen from this figure, this circuit is constituted with CMOS transistors in the same manner as in the case of two data of 4 bits shown in FIG. 1 wherein circuits for comparing respective bits are constituted with transistors $T_{31}$ to $T_{78}$. An arrangement is employed such that respective bits are inputted with the inputs of two data being inverted.

In the case of this embodiment, data $B_0$ to $B_3$ and $C_0$ to $C_3$ are inverted and inputted. When data of all bits of $A_0$ to $A_3$ and $B_0$ to $B_3$, and $A_0$ to $A_3$ and $C_0$ to $C_3$ are coincident with each other, respectively, the output Q becomes "1".

Figure 5:
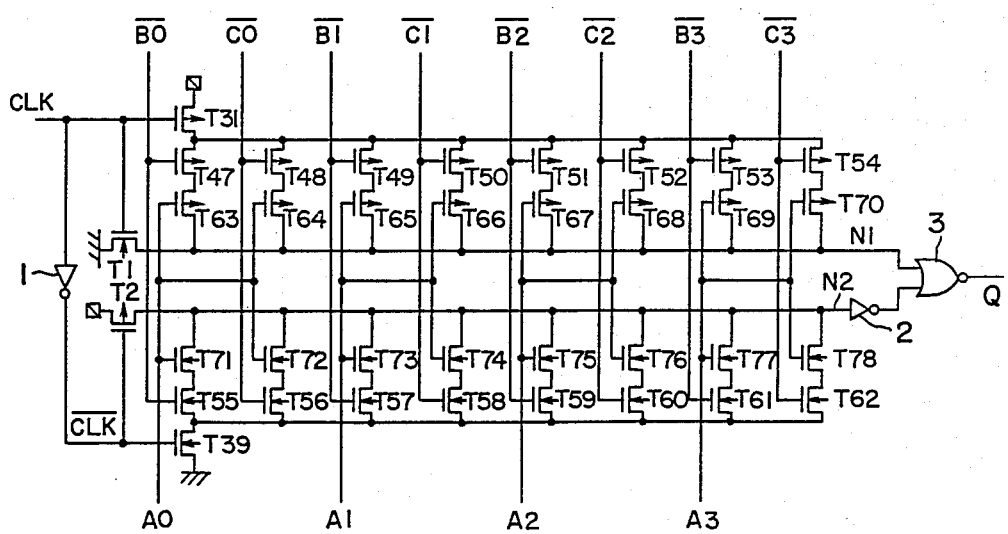
FIG. 5 is a circuit diagram showing a modification of the circuit shown in FIG. 4.

FIG. 5 is a circuit diagram showing a modification of the embodiment shown in FIG. 4. This circuit is implemented so that current supply transistors are commonly used in the same manner as in the case of FIG. 3. Namely, a P-channel transistor $T_{31}$ is substituted for P-channel transistors $T_{32}$ to $T_{38}$, and an N-channel transistor $T_{39}$ is substituted for N-channel transistors $T_{40}$ to $T_{46}$. It is expected that 14 transistors can be deleted when compared to the embodiment shown in FIG. 4.

Figure 6:
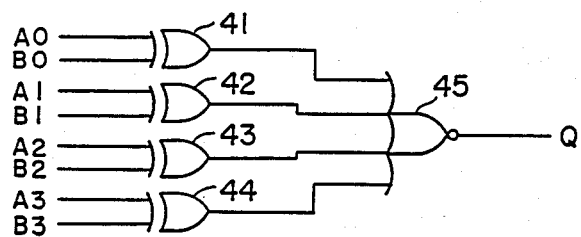
FIGS. 6 and 7 are circuit diagrams showing conventional coincidence determination circuits.

A coincidence determination circuit conventionally used, when constructed as a coincidence determination circuit for two data of 4 bits, is composed of, as shown in FIG. 6, EORs 41, 42, 43 and 44 for determining the coincidence between two data, and a NOR circuit 45 for providing an inverted logical sum of these outputs. When two data of 4 bits AO to $A_3$ and $B_0$ to $B_3$ are coincident with each other and data of all bits are thus coincident for all bits with each other, "1" appears on the output Q.

Figure 7:
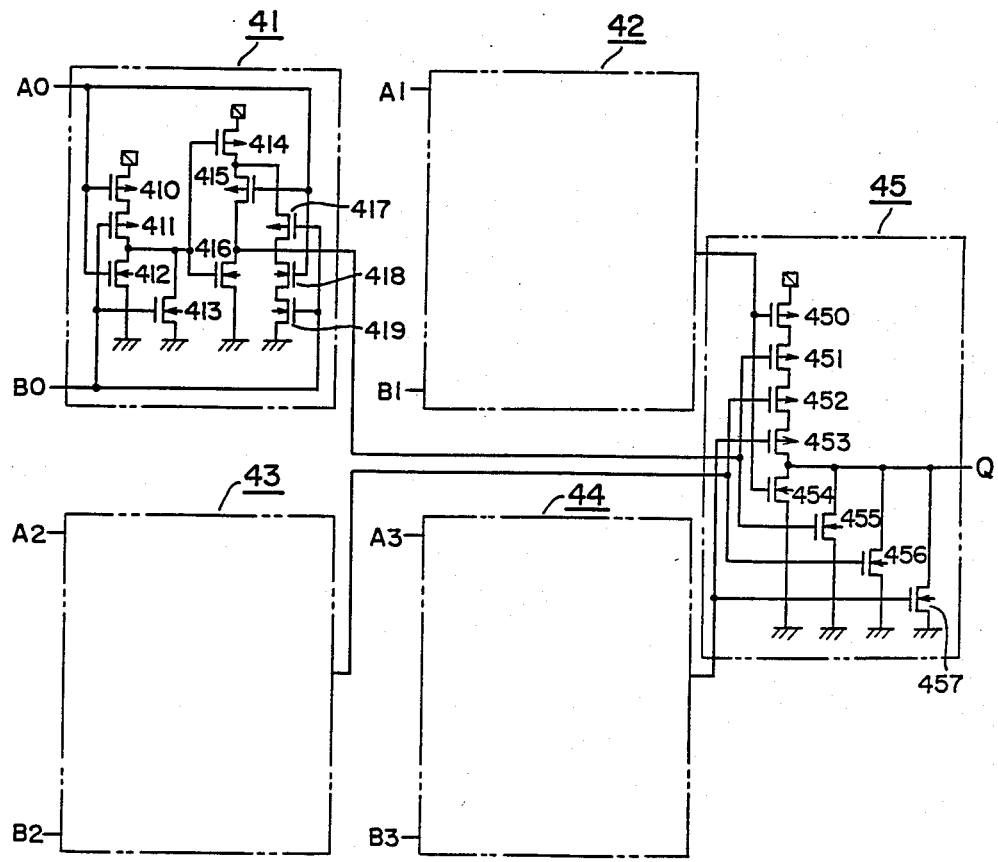

FIG. 7 is a circuit diagram showing an actual embodiment of the circuit of FIG. 6. In this embodiment, 48 MOS transistors are required, and according as the number of bits of data increases by one, the number of elements for EORs increases by ten, and the number of elements for an additional NOR, which is required because of increase of input signal by one, increases by two. Therefore the total number of elements increases by 12.

On the contrary, with the configuration shown in FIG. 1, 34 CMOS type FETs are required, and when the number of data increases by one, the number of elements increases by 6. The increase number of elements in this circuit is one half of that of the conventional circuit shown in FIG. 4.

In addition, with the configuration of FIG. 3, the number of elements is 28, which is further decreased when compared to that in the configuration of FIG. 1.

The following Table shows the relationship between the number of bits of data and the number of elements on the basis of a comparison between the conventional circuit and the circuit of this invention.

TABLE

|  | Number of bits of data | | |
| --- | --- | --- | --- |
|  | 4 | 8 | 16 |
| No. $X_1$ of elements according to this invention | 34 (FIG. 1) | 58 | 106 |
| $X_1/Y$ | 0.71 | 0.60 | 0.55 |
| No. $X_2$ of elements according | 28 | 44 | 76 |

TABLE-continued

| | Number of bits of data | | |
|---|---|---|---|
| | 4 | 8 | 16 |
| to this invention | (FIG. 3) | | |
| $X_2/Y$ | 0.58 | 0.46 | 0.40 |
| No. Y of elements according | 48 | 96 | 192 |
| to prior art | (FIG. 7) | | |

The term of X/Y in this Table represents a value obtained by dividing the number of elements required for the circuit of this invention by the number of elements required for the conventional circuit. It is apparent from changes in this value that as the number of bits of data increases, the effect of decreasing the number of elements becomes more conspicuous when compared to that of conventional circuits.

What is claimed is:

1. A coincidence determination circuit comprising:

a first comparison unit provided with a plurality of first bit comparison units corresponding to a plurality of bits, each bit comparison unit comprising a first P-channel transistor having a gate to which a clock signal is inputted, a second P-channel transistor having a gate to which reference data of a certain bit is inputted, and a third P-channel transistor having a gate to which inverted data of the data of that bit to be compared is inputted, said first to third P-channel transistors being connected in series, respective outputs of said first bit comparison units being wired-OR connected to a first output line, said first output line serving to pull its signal level down in response to said clock signal;

a second comparison unit provided with a plurality of second bit comparison units corresponding to a plurality of bits, each bit comparison unit comprising a first N-channel transistor having a gate to which an inverted signal of said clock signal is inputted, a second N-channel transistor having a gate to which reference data of a certain bit is inputted, and a third N-channel transistor having a gate to which inverted data of the data of that bit to be compared is inputted, said first to third N-channel transistors being connected in series, respective outputs of said second bit comparison units being wired-OR connected to a second output line, said second output line serving to pull its level up by said inverted signal of said clock signal; and an output unit for producing a coincidence output when said first output line is at a low level and said second output line is at a high level.

2. A coincidence determination circuit as set forth in claim 1, wherein said first P-channel transistor in the first comparison unit and said first N-channel transistor in the second comparison unit are used in common to respective bits.

* * * * *